United States Patent [19]

Economy et al.

[11] 4,289,573

[45] Sep. 15, 1981

[54] PROCESS FOR FORMING MICROCIRCUITS

[75] Inventors: James Economy, San Jose; James R. Lyerla, Menlo Park; Lester A. Pederson, San Jose, all of Calif.

[73] Assignee: International Business Machines Corporation, Armonk, N.Y.

[21] Appl. No.: 126,913

[22] Filed: Mar. 3, 1980

Related U.S. Application Data

[63] Continuation-in-part of Ser. No. 25,292, Mar. 30, 1979, abandoned.

[51] Int. Cl.$^3$ .................... H01L 21/306; B44C 1/22; C03C 15/00; C03C 25/06
[52] U.S. Cl. .................... 156/643; 156/646; 156/657; 156/659.1; 204/192 E; 427/341; 430/5; 430/313; 430/317
[58] Field of Search .................... 427/39, 41, 259, 43.1, 427/341; 430/5, 313, 314, 317, 318, 319, 323; 204/192 E; 156/643, 646, 657, 659.1, 662, 663; 252/79.1

[56] References Cited

U.S. PATENT DOCUMENTS

| 4,078,102 | 3/1978 | Bendz et al. | 427/341 |
| 4,093,461 | 6/1978 | Loprest et al. | 430/328 X |
| 4,208,211 | 6/1980 | Bowden | 156/643 X |

Primary Examiner—William A. Powell
Attorney, Agent, or Firm—Joseph G. Walsh

[57] ABSTRACT

The resistance of a resist of plasma etching is enhanced by first cross-linking the resist and then contacting it with an aqueous solution of NaOH or KOH. The process is useful to form microcircuits having increased density of geometry.

4 Claims, No Drawings

PROCESS FOR FORMING MICROCIRCUITS

The present application is a continuation-in-part of copending application Ser. No. 25,292, filed on Mar. 30, 1979, now abandoned.

DESCRIPTION

1. Technical Field

The present invention is concerned with a process for forming microcircuits. In particular, it is concerned with such a process in which the resistance of a lithographic resist to plasma etching is increased and thereby the density of the resulting microcircuits geometry is increased.

2. Background Art

Plasma etching is well known in the art. See, for example, the Journal of Vacuum science Technology, Vol. 14 No. 1, p. 466, 1977, and Electronics, pages 89–98, May 12, 1977.

In the past, however, lithographic resist systems have been found to provide marginal etch resistance to dry plasma etch processing in the manufacture of microcircuits. Up to the present, thick layers of resist had to be used to insure adequate protection of the substrate from undesirable etching in unpatterned areas. The density of the resulting device geometry was therefore limited and registration was also adversely affected. The present invention allows significant reduction in the resist thickness so that as little as 1/10 to ⅔ of the prior art thicknesses need be used.

The cross-linking involved in the present process is not per se novel, as is shown, for example, in U.S. Pat. No. 4,007,047. There is nothing in that patent, however, which suggests the treatment with metal ions.

IBM Technical Disclosure Bulletin, Vol. 20 No. 7, Dec. 1977, page 2706 shows a process for hardening a resist film by treating the film with an oxidizing agent. That reference, however, does not show the use of either sodium hydroxide, or potassium hydroxide, as required by the present invention.

DISCLOSURE OF THE INVENTION

According to the present invention, the resist film is first prepared by conventional means such as spin-coating, baking, exposing and developing. The resist is then subjected to additional cross-linking by whatever means is appropriate to the particular resist. This could be, for example, pre-exposure to plasma, or treatment with an acid-formaldehyde solution. Following this cross-linking, the surface of the resist is contacted with an aqueous solution of sodium hydroxide of potassium hydroxide. During this contacting, sodium ions or potassium ions are taken up by the resist. The resist thereby acquires enhanced resistance to etching by commonly used plasma etching methods. The term plasma etching is used here in its broad sense, to include reactive ion etching.

The surface of the resist system subjected to the present invention can be varied as to depth of penetration of sodium ion or potassium ion, thereby providing a means to control the degrees of resistance to etching, with a concomitant control of etch profiles.

The process of the present invention is applicable to any of a wide variety of resists, particularly those which contain replaceable hydrogen, for example, carboxylic acid groups and phenolic groups. In particular, this approach has given outstandingly good results with resins comprising phenol-formaldehyde resins or derivatives thereof, and with polymers and copolymers of methacrylic acid and/or methacrylic anhydride. In particular, a terpolymer of methyl methacrylate, methacrylic acid and methacrylic anhydride has given outstanding results when used in the present invention.

To remove the metal containing resist, one can use any of several different methods, for example, an oxygen ashing, followed by a water or dilute acid rinse, will remove both the resist and the metal. One could also treat directly with dilute acid to remove the metal ion.

In summary, according to the process of the present invention, microcircuits are formed by first forming on a substrate a resist film of a resin containing hydrogen which reacts with NaOH or KOH. The film is then subjected to lithographic processing by any conventional means, for example imagewise exposure to light to create a circuit pattern of exposed and unexposed areas, and then developing the film by treatment with a selective solvent. The film is then cross-linked, and treated with an aqueous solution of either NaOH or KOH. It is the subjected to plasma ion etching to create the microcircuit.

BEST MODES OF CARRYING OUT THE INVENTION

EXAMPLE 1

Three 2-micron thick films of a m-cresol/formaldehyde resin with photoactive compound were spin-coated on silicon dioxide surface wafers and heated at 80° C. for 15 minutes, then at 130° C. for 30 minutes. Two of these films were then cross-linked by reaction in aqueous hydrochloric acid/formaldehyde solution at 85° C. for 15 minutes.

One cross-linked film was immersed in 25% aqueous sodium hydroxide solution for one minute. All three films were then heated at a temperature between 170° and 180° C. for 30 minutes. The three films were then etched in an 8% oxygen 92% carbontetrafluoride plasma at 0.55 Torr, 200 watts r.f.

The film treated with sodium hydroxide in accordance with the present invention exhibited an etch rate of 340Å per minute, as opposed to a rate of 640Å per minute for the other two films.

EXAMPLE 2

Two quartz disks were overcoated with about two microns of a similar type of resist used in Example 1 above. The disks were heated at 85° C. for 30 minutes, then soaked in a standard developer for 2 minutes, and then washed for 5 minutes with water. One of the disks was cross-linked as in Example 1 above, in a solution of 25% aqueous sodium hydroxide for 1½ minutes, and then dipped briefly in water before drying.

Both disks were heated at a temperature of from 185° to 190° C. for 30 minutes. The disks were then etched in a diode configured carbontetrafluoride plasma.

The etch rate ratios of untreated to treated films were 1.48 at 100$\mu$ pressure and 50 watts r.f., 1.31 at 100$\mu$ pressure and 100 watts r.f. and 2.16 at 20$\mu$ pressure and 50 watts r.f.

EXAMPLE 3

A silicon wafer was spin coated with a terpolymer of methacrylic acid, methymethacrylate and methacrylic anhydride. The coated wafer was heated in an oven at 180° C. for 30 minutes in air. It was then soaked for 15 minutes in a 25% v/v solution of diphenyldichlorosilane in toluene. It was next rinsed in toluene and then heated on a hot plate for 10 minutes at a temperature between 80° and 90° C. The wafer was then immersed in 0.1 normal aqueous sodium hydroxide and then dipped in deionized water. It was next spin dried and heated at 120° C. for 30 minutes.

Plasma etching was carried out in a carbontetrafluoride/oxygen discharge at 0.55 torr and 200 watts r.f. A significant reduction in removal of terpolymer was seen in the treated cases. Only 4000Å units of film was removed in 0.5 hours, while a 2-micron thick untreated film was removed in about 20 minutes. In about 30 minutes the treated film increased in etch rate to a value of about 900Å per minute. This rate was still less than the equilibrium etch rate of untreated terpolymers, which was about 2400Å per minute. Under the plasma etch conditions, two microns of silicon were removed in less than 10 minutes and two microns of $SiO_2$ in about 30 minutes, respectively, thus illustrating the usefulness of the present invention.

We claim:

1. The process for forming a microcircuit comprising the steps of:
    (1) forming on a substrate a resist film of resin containing hydrogen replaceable by reaction with NaOH or KOH;
    (2) subjecting said resist film to lithographic processing;
    (3) cross-linking said resist film;
    (4) contacting the surface of said resist film with an aqueous solution of NaOH or KOH; and
    (5) exposing said resist film to plasma etching.

2. A process as claimed in claim 1 in which the resist comprises a phenol-formaldehyde resin or a derivative thereof.

3. A process as claimed in claim 1 in which the resist comprises methacrylic acid as a monomer or comonomer.

4. A process as claimed in claim 1 in which the resist comprises methacrylic anhydride as a monomer or comonomer.

* * * * *